United States Patent
Chaudhari

(10) Patent No.: US 9,059,371 B2
(45) Date of Patent: Jun. 16, 2015

(54) ENHANCING CRITICAL CURRENT DENSITY OF CUPRATE SUPERCONDUCTORS

(75) Inventors: Praveen Chaudhari, Briarcliff Manor, NY (US); Karin Chaudhari, legal representative, Briarcliff Manor, NY (US); Ashok Chaudhari, legal representative, Briarcliff Manor, NY (US); Pia Chaudhari, legal representative, Briarcliff Manor, NY (US)

(73) Assignee: Solar-Tectic LLC, Briarcliff Manor, NY (US)

( * ) Notice: Subject to any disclaimer, the term of this patent is extended or adjusted under 35 U.S.C. 154(b) by 725 days.

(21) Appl. No.: 13/155,508

(22) Filed: Jun. 8, 2011

(65) Prior Publication Data

US 2012/0142536 A1 Jun. 7, 2012

Related U.S. Application Data

(60) Provisional application No. 61/444,457, filed on Feb. 18, 2011.

(51) Int. Cl.
 *H01L 39/24* (2006.01)

(52) U.S. Cl.
 CPC .................................. *H01L 39/2483* (2013.01)

(58) Field of Classification Search
 CPC . H01L 39/2483; H01L 39/126; H01L 39/148; H01L 39/2425; H01B 12/02; H01B 12/06
 USPC ......... 505/125, 126, 150, 320, 434, 470, 704; 427/62, 63
 See application file for complete search history.

(56) References Cited

U.S. PATENT DOCUMENTS

| 6,569,811 | B1 | 5/2003 | Shi | |
|---|---|---|---|---|
| 7,838,061 | B2* | 11/2010 | Oh et al. | 427/62 |
| 8,124,568 | B2* | 2/2012 | Hayashi et al. | 505/234 |
| 2005/0159298 | A1* | 7/2005 | Rupich et al. | 502/100 |
| 2008/0176749 | A1* | 7/2008 | Goyal | 505/125 |

FOREIGN PATENT DOCUMENTS

| EP | 0303813 A2 | 2/1989 | |
|---|---|---|---|
| EP | 303813 A2 * | 2/1989 | H01L 39/12 |

OTHER PUBLICATIONS

Tsuei, C.C. et ano. "Pairing Symmetry in Cuprate Superconductors", Reviews of Modern Physics, vol. 72, No. 4, Oct. 2000, pp. 969-1016, The American Physical Society.*

Chaudhari, P. et ano. "Grain Boundaries in the Cuprate Superconductors:Tapes and Tunneling Spectroscopy", Superconductor Science and Technology, 23, 2010, pp. 1-6, UK.

(Continued)

*Primary Examiner* — Colleen Dunn

(74) *Attorney, Agent, or Firm* — Keith D. Nowak; Libby Babu Varghese; Carter Ledyard & Milburn LLP

(57) ABSTRACT

The present invention concerns the enhancement of critical current densities in cuprate superconductors. Such enhancement of critical current densities include using wave function symmetry and restricting movement of Abrikosov (A) vortices, Josephson (J) vortices, or Abrikosov-Josephson (A-J) vortices by using the half integer vortices associated with d-wave symmetry present in the grain boundary.

10 Claims, 1 Drawing Sheet

(56) References Cited

OTHER PUBLICATIONS

Feldmann, D.M. et al. "Mechanisms for Enhanced Supercurrent Across Meandered Grain Boundaries in High-Temperature Superconductors", Journal of Applied Physics, 102, 2007, pp. 1-5, US.

Goyal A. et al. "The Rabits Approach:Using Rolling-Assisted Biaxially Textured Substrates for High-Performance YBCO Superconductors", MRS Bulletin, Aug. 2004, pp. 552-561, US.

Iijima Y. et al. "Research and Development of Biaxially Textured IBAD-GZO Templates for Coated Superconductors", MRS Bulletin, Aug. 2004, pp. 564-571, US.

Tsuei, C.C. et ano. "Pairing Symmetry in Cuprate Superconductors", Reviews of Modern Physics, vol. 72, No. 4, Oct. 2000, pp. 969-1016, The American Physical Society, US.

Hilgenkamp, H., Mannhart, J. "Grain Boundaries in High-Tc Superconductors", Apr. 2002, pp. 485-549, vol. 74, Review of Modern Physics, USA.

PCT International Search Report, Jun. 20, 2012, USA.

Wagner, R.S., Ellis, W.C., "The Vapor-Liquid-Solid Mechanism of Crystal Growth and its Application to Silicon", Transactions of the Metallurgical Society of AIME, Jun. 1965, pp. 1053-1064,vol. 233, American Institute of Mining, Metallurgical, and Petroleum Engineers, US.

Wagner, R.S., Ellis, W.C., "Vapor-Liquid-Solid Mechanism of Single Crystal Growth", Applied Physics Letters, Mar. 1, 1964, pp. 89-90, vol. 4, No. 5, American Institute of Physics, US.

* cited by examiner

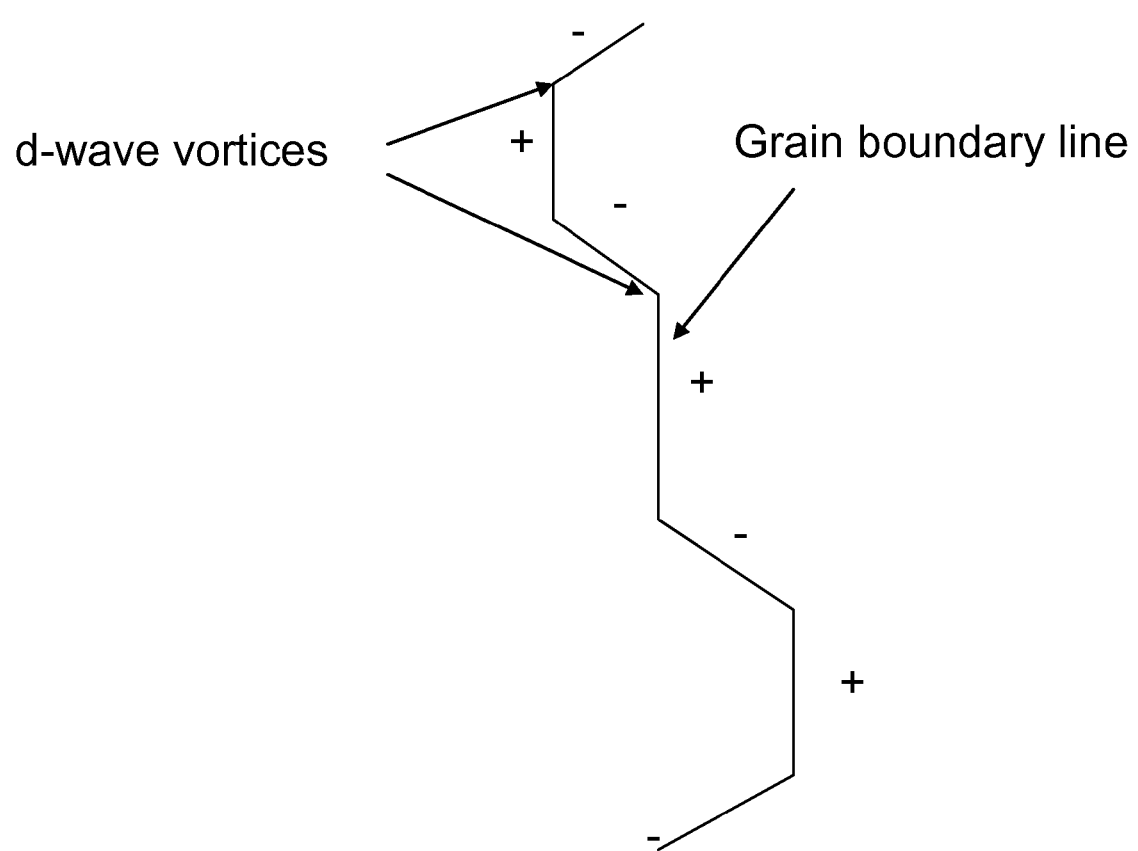

ENHANCING CRITICAL CURRENT DENSITY OF CUPRATE SUPERCONDUCTORS

PRIORITY AND RELATED APPLICATION

This application claims priority to U.S. Provisional Patent Application Ser. No. 61/444,457 filed Feb. 18, 2011 entitled "ENHANCING CRITICAL CURRENT DENSITY OF CUPRATE SUPERCONDUCTORS" which is hereby incorporated by reference in its entirety.

STATEMENT REGARDING FEDERAL SUPPORT

This invention was made with U.S. Government support under contract number DE-ACO2-98CH 10886, awarded by the U.S. Department of Energy. The Government has certain rights in the invention.

FIELD OF THE INVENTION

The present invention relates to superconductors, particularly to the current carrying capabilities of superconductors.

BACKGROUND OF THE INVENTION

The role of high temperature superconductivity in energy related fields is widely accepted. A serious limitation to the wide spread use of these materials is the cost and complexity of producing these materials in a form suitable for large scale uses. It is already known that the critical current densities in the high temperature cuprate semiconductor (HiTc) materials are very high in single crystal epitaxial films, that grain boundaries are Josephson coupled and hence limit the critical current densities in polycrystalline materials and the critical current densities across grain boundary is a function of the misorientation angles of two grains adjoining the boundary.

As stated above, the critical current density of the cuprate superconductors is limited by grain boundaries. The critical current density in a magnetic field of a low angle grain boundary is further limited by the motion of Abrikosov (A) vortices, Josephson (J) vortices, or Abrikosov-Josephson (A-J) vortices. These vortices experience a Lorentz force when a combination of current flow and magnetic field are present and move along the grain boundary. Movement of the vortices causes a decrease in the critical current.

Current density is also affected by the misorientation angle between two adjoining grains; the larger the misorientation angle between two adjoining grains the smaller the current density. Thus a great deal of effort has been expended around the world to develop manufacturing processes that minimize the misorientation angle between two grains. Even in these low angle boundaries the critical current is not as high as desirable. Accordingly a method is desired to enhance the critical current density. A method is desired that will enhance the critical current density using fundamental properties of the materials. A method is further desired that will enhance the critical current density using wave function symmetry. An object of the present invention is to use spatially and temporally bound vortices formed in a d-wave superconductor to impede the motion of Abrikosov and Josephson vortices. A method is also desired to fabricate cuprate superconducting tapes on single crystal metallic substrates.

BRIEF SUMMARY OF THE INVENTION

A method is disclosed to restrict movement of Abrikosov (A) vortices, Josephson (J) vortices, or Abrikosov-Josephson (A-J) vortices using the half integer vortices associated with d-wave symmetry present in the grain boundary. These d-wave associated vortices are spatially locked and cannot be moved by currents and magnetic. When these d-wave associated vortices are present at grain boundaries the motion of A, A-J, and J vortices are blocked.

BRIEF DESCRIPTION OF THE DRAWING

FIG. 1 shows a grain boundary line along with its meandering structure illustrating how and where the d-wave vortices are present.

DETAILED DESCRIPTION OF THE INVENTION

The present invention provides a method to enhance the critical current density by using fundamental properties of the cuprate superconductor and impeding the motion of Abrikosov (A) vortices, Josephson (J) vortices, or Abrikosov-Josephson (A-J) vortices. The fundamental properties of the cuprate superconductor that are employed herein include wave function symmetry such as d-wave associated vortices. The grain boundary of cuprate superconductors is a planar defect. The way to introduce d-wave vortices is to produce grain boundaries in which the plane of the grain boundary meanders by plus or minus .pi./4 angle. Four d-wave associated vortices are introduced at each such meander. These are spatially and temporally locked in place. If a large enough number of this type of meandering is present the critical current of this boundary can approach its thermodynamic limit. FIG. 1 shows a grain boundary line along with its meandering structure to illustrate how and where the d-wave vortices are present. The average plane is in the vertical direction. The plus and minus indicate segments of the grain boundary which have a positive or negative lobe of the d-wave influencing it, resulting in d-wave associated half integer vortices at the corners.

By using the half integer vortices associated with d-wave symmetry present in the grain boundary the motion of vortices is pinned down as the d-wave associated vortices are spatially locked and cannot be moved by currents and magnetic fields. These d-wave associated vortices can be destroyed by increasing the current and magnetic fields to values close to the thermodynamic limits of the stability of the superconductor. These values are, however, very much larger than any value attained in practice. When these d-wave associated vortices are present at grain boundaries the motion of A, A-J, and J vortices are blocked. With these spatially and temporally bound vortices formed in a d-wave superconductor the motion of Abrikosov and Josephson vortices is impeded.

A traditional method of introducing d-wave associated vortices in grain boundaries of cuprate superconductors includes taking metal-organic particles in solution which are spread out on buffered tapes with an aligned template. As the particles are sintered at high temperature they realign themselves with the buffered tapes and produce the low misorientation angle grain boundaries. In the present invention, two methods are proposed to make these boundaries rough. In a first method, two very different sized metallic particles are sintered together which results in a packing such that the grain boundaries are rough. In another method, inert needle-like or nanowires are included with the metal-organic solution which prevent grain boundary migration during the sintering process giving rise to rough grain boundary surfaces. The methods of the present invention thus provide ways to fabricate cuprate superconducting tapes on single crystal metallic substrates.

While the present invention has been described in conjunction with specific embodiments, those of normal skill in the art will appreciate the modifications and variations can be made without departing from the scope and the spirit of the present invention. Such modifications and variations are envisioned to be within the scope of the appended claims.

The invention claimed is:

1. A method of creating meandering grain boundaries in superconducting cuprate tape comprising:
    introducing half integer d-wave symmetry associated vortices at grain boundaries; and
    sintering two different sized metallic particles together creating rough boundaries, wherein movement of Abrikosov-Josephson vortices along said grain boundaries is restricted.

2. The method of claim 1, wherein said d-wave symmetry associated vortices are created by meandering the grain boundaries $\pm\pi/4$ angle.

3. The method of claim 2, wherein said meandering grain boundaries are created by said sintering of said two different sized metallic particles together.

4. The method of claim 2, wherein said meandering grain boundaries are created by including inert needle-like particles with metal-organic solutions.

5. The method of claim 2, wherein said meandering grain boundaries are created by including nanowires with metal-organic solutions.

6. The method of claim 2, wherein said meandering grain boundaries have low angles.

7. A method of creating meandering grain boundaries in superconducting cuprate tape comprising including inert needle-like particles with metal-organic solutions creating rough boundaries.

8. A method of creating meandering grain boundaries in superconducting cuprate tape comprising sintering two different sized metallic particles together creating rough boundaries.

9. The method of claim 8 producing a superconducting tape on a single crystal metallic substrate.

10. A method of creating meandering grain boundaries in superconducting cuprate tape comprising:
    introducing half integer d-wave symmetry associated vortices at grain boundaries; and
    including nanowires with metal-organic solutions creating rough boundaries, wherein movement of Abrikosov-Josephson vortices along said grain boundaries is restricted.

* * * * *